United States Patent
Reid (10) Patent No.: US 9,660,614 B2
(45) Date of Patent: May 23, 2017

(54) STACKED, SWITCHED FILTER BANKS

(71) Applicant: Nuvotronics, Inc., Radford, VA (US)

(72) Inventor: J. Robert Reid, Billerica, MA (US)

(73) Assignee: NUVOTRONICS, INC., Radford, VA (US)

( * ) Notice: Subject to any disclaimer, the term of this patent is extended or adjusted under 35 U.S.C. 154(b) by 0 days.

(21) Appl. No.: 15/218,574

(22) Filed: Jul. 25, 2016

(65) Prior Publication Data

US 2017/0033773 A1 Feb. 2, 2017

Related U.S. Application Data (60) Provisional application No. 62/199,591, filed on Jul. 31, 2015.

(51) Int. Cl.
*H03K 5/00* (2006.01)
*H03H 7/01* (2006.01)
*H03H 19/00* (2006.01)

(52) U.S. Cl.
CPC ................... *H03H 19/004* (2013.01)

(58) Field of Classification Search
CPC ............ H03H 11/0422; H03H 11/04; H03H 11/1291; H03H 11/1213; H03K 5/1252

USPC .................. 327/551–559; 439/578–585; 333/165–167

See application file for complete search history.

(56) References Cited

U.S. PATENT DOCUMENTS

| | | | | |
|---|---|---|---|---|
| 3,742,390 A * | 6/1973 | Stiglitz | ................ | H01P 1/2135 333/134 |
| 5,166,965 A * | 11/1992 | Collier | ................ | H02M 7/10 336/200 |
| 5,940,674 A | 8/1999 | Sachs | | |
| 6,281,769 B1 * | 8/2001 | Fiedziuszko | ............ | H01P 1/203 333/239 |
| 6,329,949 B1 * | 12/2001 | Barnett | ................ | H01Q 1/246 333/202 |
| 2001/0045361 A1 | 11/2001 | Boone | | |
| 2011/0123794 A1 | 5/2011 | Hiller | | |

OTHER PUBLICATIONS

Derwent Abstract Translation of WO-2010-011911 A2 (published 2010).

* cited by examiner

*Primary Examiner* — Dinh T Le
(74) *Attorney, Agent, or Firm* — Niels Haun; Dann, Dorfman, Herrell & Skillman P.C.

(57) ABSTRACT

Switched filter banks realized in a stacked arrangement.

15 Claims, 12 Drawing Sheets

STACKED, SWITCHED FILTER BANKS

RELATED APPLICATIONS

This application claims the benefit of priority of U.S. Provisional Application No. 62/199,591, filed on Jul. 31, 2015, the entire contents of which application(s) are incorporated herein by reference.

FIELD OF THE INVENTION

The present invention relates generally to switched filter banks which are realized in a stacked arrangement.

BACKGROUND

Switched filter banks may be used in RF transmitters and receivers to provide adaptability over a range of frequencies and sensitivity requirements. Typically, switched filter banks include an input switch matrix that is 1:N, a filter bank consisting of N filters, and an output N:1 switch matrix. The filter bank is most commonly formed from a set of N discrete filters that are either individually connectorized, or solder mounted onto a printed circuit board. It is critical that isolation between individual filters be maintained. As a result, planar implementations typically require milled metal channels to isolate the individual filters which results in the overall filter bank becoming large and taking up more area than desired. Stripline filter bank implementations also exist, but these require via walls and significant physical space between filter channels to maintain the desired filter to filter isolation. The large space required to achieve the desired isolation between individual filters results in a part that has higher cost, volume, and mass than is desired. Hence, there remains a need in the art for improved switched filter banks which do not suffer from the aforementioned deficiencies.

SUMMARY OF THE INVENTION

In one of its aspects the present invention relates to compact filter banks and integrated switched filter banks that may be created by integrating one more filters into compact filter cards using Nuvotronics' proprietary PolyStrata® microfabrication technology or other suitable additive build technology (see, for example, U.S. Pat. Nos. 7,012,489, 7,649,432, 7,948,335, 7,148,772, 7,405,638, 7,656,256, 7,755,174, 7,898,356, 8,031,037, 2008/0199656, 2011/0123783, 2010/0296252, 2011/0273241, 2011/0181376, and 2011/0210807, 2014/0231266, the contents of which are incorporated herein by reference, hereinafter the "incorporated Poly Strata® Technology"). As used herein, the term "PolyStrata®" denotes devices made by, or methods detailed in, any of the aforementioned incorporated Poly Strata® Technology. Stacked switched filter banks of the present invention may thus be provided in the form of a 3-D structure, such as a dielectric (e.g., air) spaced coaxial transmission lines and resonators. PolyStrata® Technology can enable a range of high performance filter approaches including (but not limited) interdigital, comb-line, cavity, distributed element, lumped, pseudo-lumped, and a variety of other transmission line based filtering approaches. Both low pass and band pass filter configurations may be realized in PolyStrata® Technology. Using PolyStrata® Technology, such filters may achieve lower insertion loss for equivalent rejection requirements than competing planar technologies, because PolyStrata® Technology can enable filters with higher quality factors than standard strip-line or microstrip implementations. At the same time, PolyStrata® Technology can provide filters that are fully enclosed by metal ground walls in all directions, permitting better control of undesired spurious passbands above the main filter passband.

Individual filter cards of the present invention may include one or more filters and transmission line routing. Multiple filter cards may be stacked together in the vertical direction to provide for increased density of filters in a given surface area. Switching networks may be directly integrated onto the PolyStrata® assembly to create a switched filter bank. Alternatively, the stacked filter bank may be mounted onto a printed circuit board in conjunction with switching matrices and control circuitry to create a highly integrated compact switch matrix.

Accordingly, the present invention may provide a stacked, switched filter bank, comprising: a first filter board having opposing upper and lower surfaces and having a filter disposed therein, the filter having an input coaxial transmission line and an output coaxial transmission line, the transmissions lines each having a portion perpendicular to, and terminating at, the lower surface; and a second filter board having top surface disposed proximate the lower surface of the first filter board, the second filter board having a filter disposed therein and having two pass-through coaxial transmission lines each of which is disposed in electrical communication with a respective one of the input and output coaxial transmissions lines of the first filter board. Each of the coaxial transmission lines of the first and second filter boards may include an air-filled coaxial transmission line. The filters of the first and/or second filter boards may include resonators disposed in a dielectric filled cavity or air-filled cavity. In addition, one or more switches may be operably connected to each of the filters of the first and second filter boards.

The present invention may also provide a method of forming a stacked, switched filter bank by a sequential build process, comprising depositing a plurality of layers, wherein the layers comprise one or more of a conductive material and a sacrificial photoresist material, thereby forming a structure. The structure may include: a first filter board having opposing upper and lower surfaces and having a filter disposed therein, the filter having an input coaxial transmission line and an output coaxial transmission line, the transmissions lines each having a portion perpendicular to, and terminating at, the lower surface; and, a second filter board having top surface and having a filter disposed therein and having two pass-through coaxial transmission lines. The boards may be stacked such that the top surface of the second filter board is proximate the lower surface of the first filter board and such that each of pass-through coaxial transmission lines is disposed in electrical communication with a respective one of the input and output coaxial transmissions lines of the first filter board.

BRIEF DESCRIPTION OF THE DRAWINGS

The foregoing summary and the following detailed description of exemplary embodiments of the present invention may be further understood when read in conjunction with the appended drawings, in which.

DETAILED DESCRIPTION OF THE INVENTION

Referring now to the figures, wherein like elements are numbered alike throughout, aspects of the present invention are illustrated which relate to switched filter banks which may be stacked. In particular, FIGS. 1-5 schematically illustrate some exemplary configurations in accordance with the present invention showing how individual filter/routing boards may be arranged relative to one another, as well as relative to switches, control circuits, and/or printed circuit boards. In one exemplary configuration, one or more of the filter/routing boards may be made using PolyStrata® Technology or an additive technology. (As used throughout the figures, the abbreviation "PS" denotes structures which may be made by the PolyStrata® Technology.) The stacked and switched configurations contemplated by the present invention may permit each filter/routing board to include one or more filters to provide a variety of filters in the assembled stack, and at the same time may provide electrical pathways (routing) through a particular board to allow electrical signals from a different board in the stack to be passed therethrough for electrical communication with other system components outside of the filter/routing board stack, such as a printed circuit board. Selection among the filters in the stack may be provided by switches, which may be provided by a range of switching technologies including electromechanical switches, pin diode switches, or transistor based switches, for example.

Figure 1:
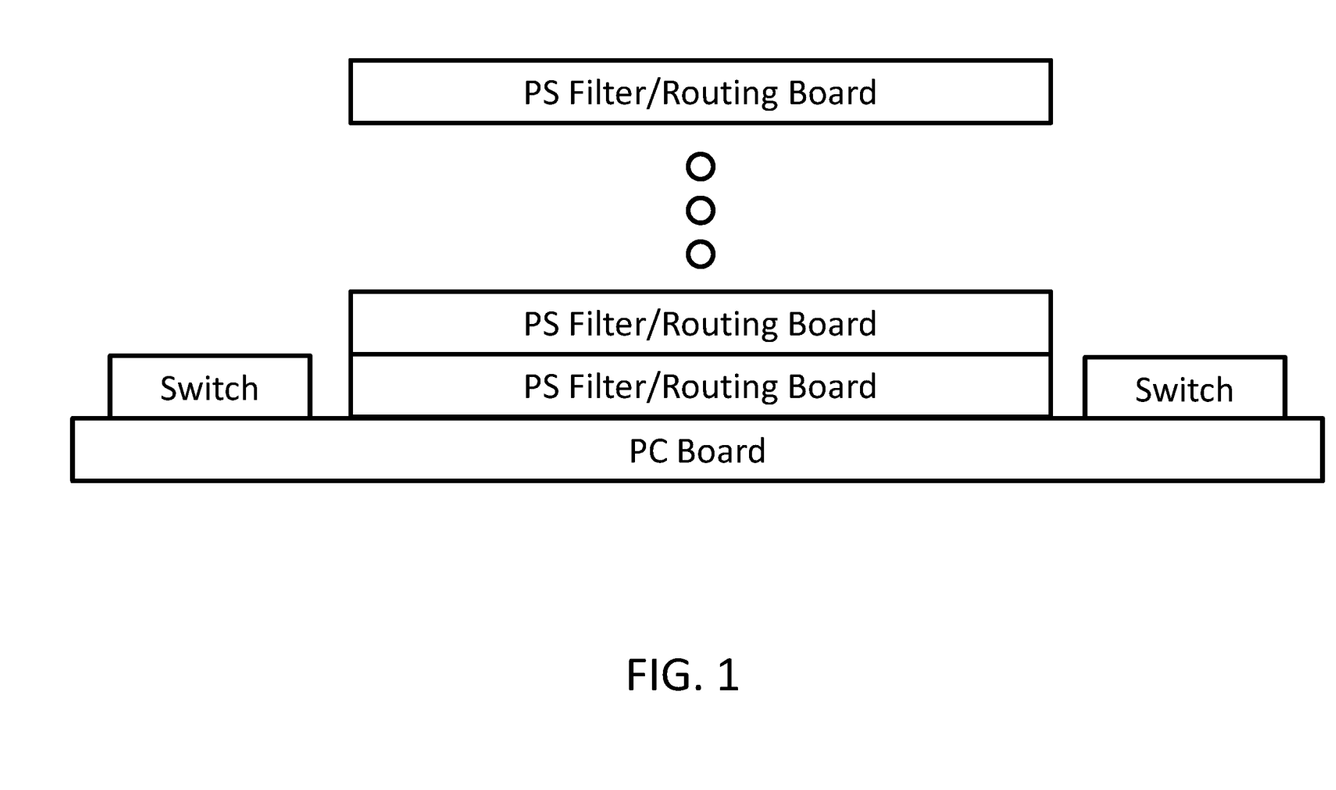
FIGS. 1-5 schematically illustrate various exemplary stacking arrangements of filter boards in accordance with the present invention.
Figure 2:
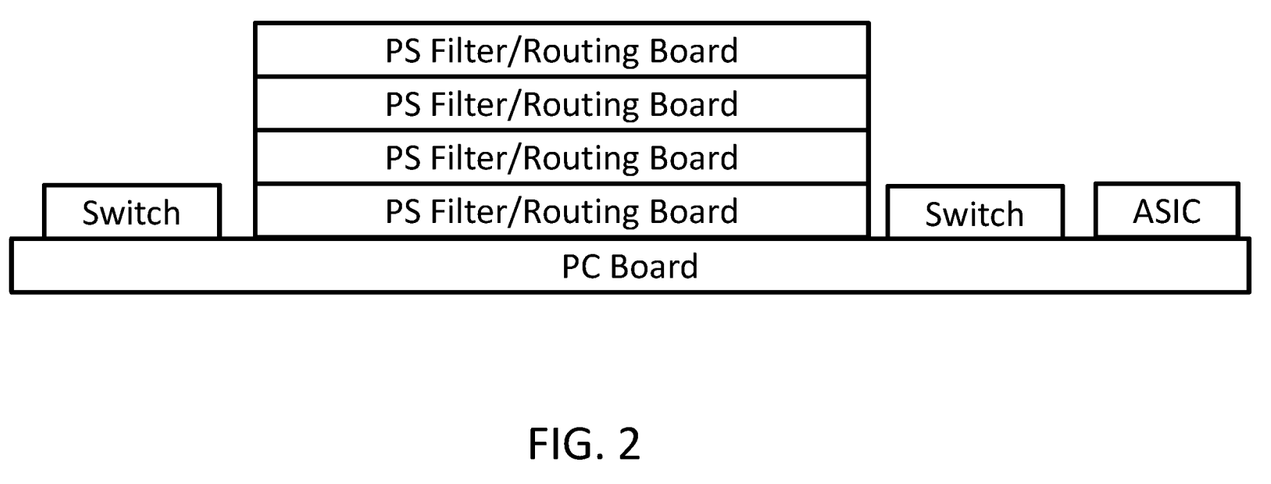
Figure 3:
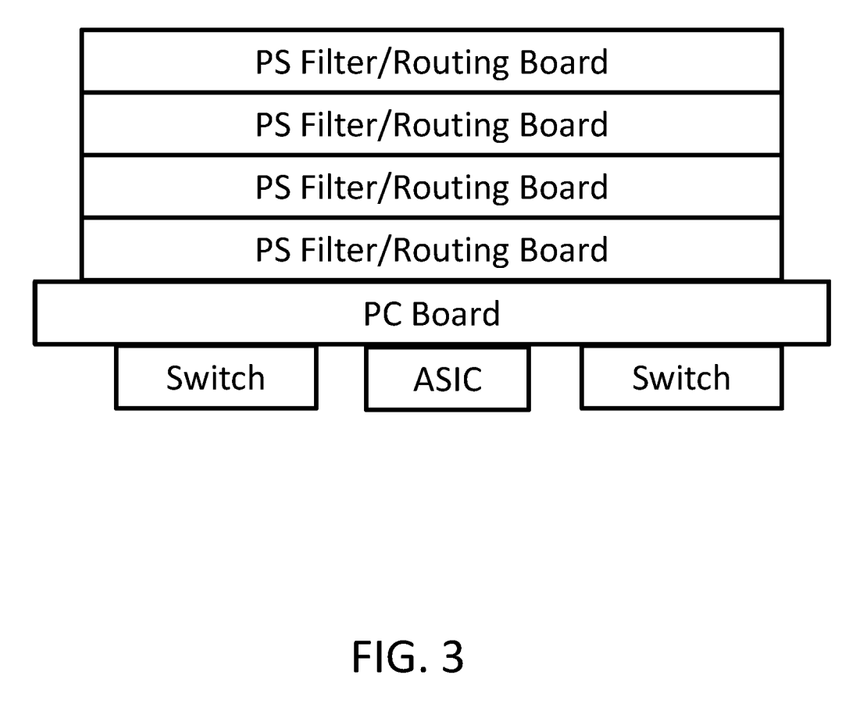
Figure 4:
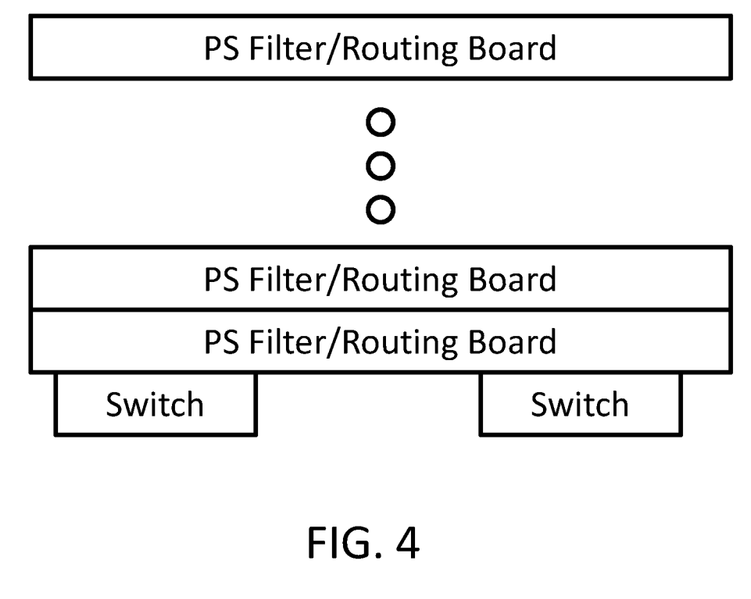
Figure 5:
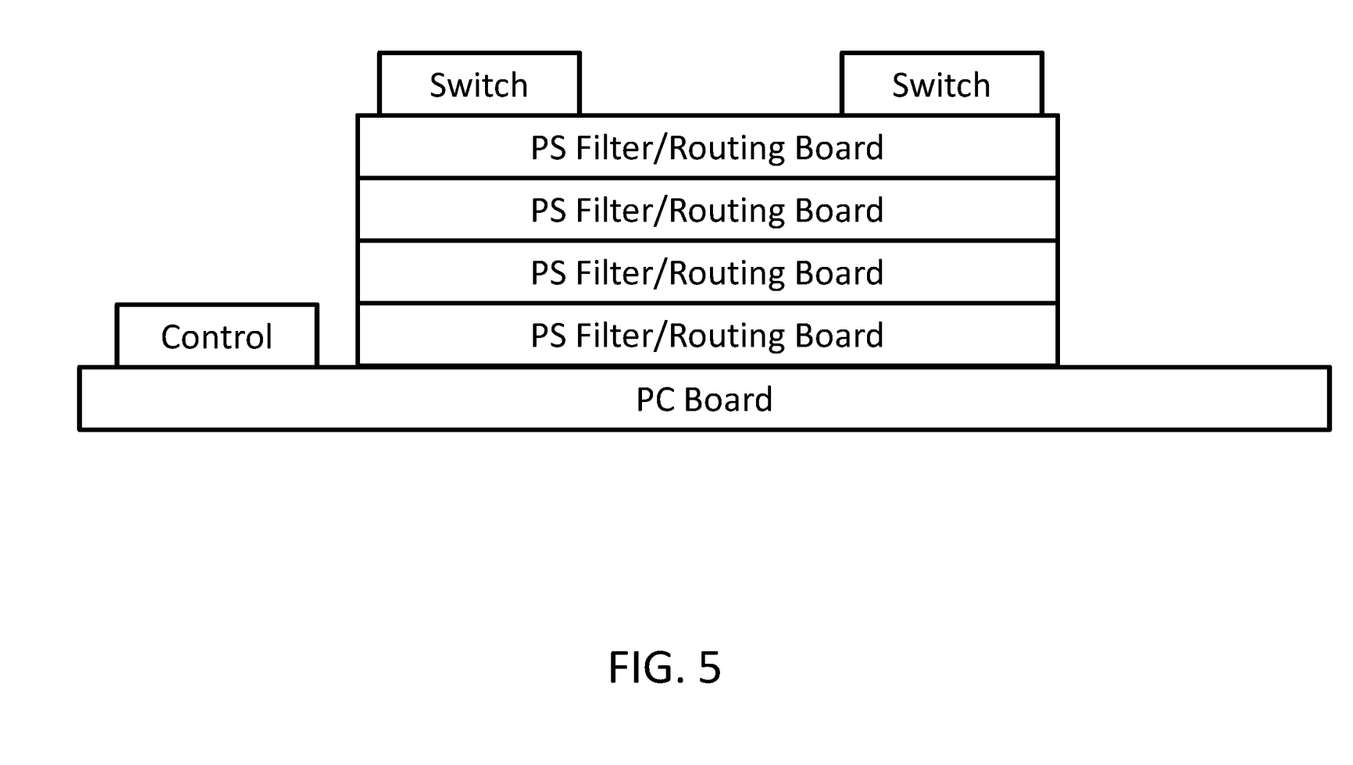

For example, as illustrated in FIG. 1, a plurality of PS filter/routing boards may be provided in stacked arrangement and disposed on, and in electrical communication with, a printed circuit (PC) board. In addition, switches may be mounted to the PC board electrical communication with the PS filter/routing boards via the PC board. Further, an application-specific integrated circuit (ASIC) may be provided on the printed circuit board, FIG. 2. The switches and/or ASIC may be provided on the same surface of the PC board as the PS filter/routing boards, FIG. 2, or on an opposing side of the PC board, FIG. 3. Still further, switches may be provided directly on the PS filter/routing boards rather than the PC board, FIG. 5, and the PS filter/routing boards may be used without a PC board, FIG. 4.

Figure 6:
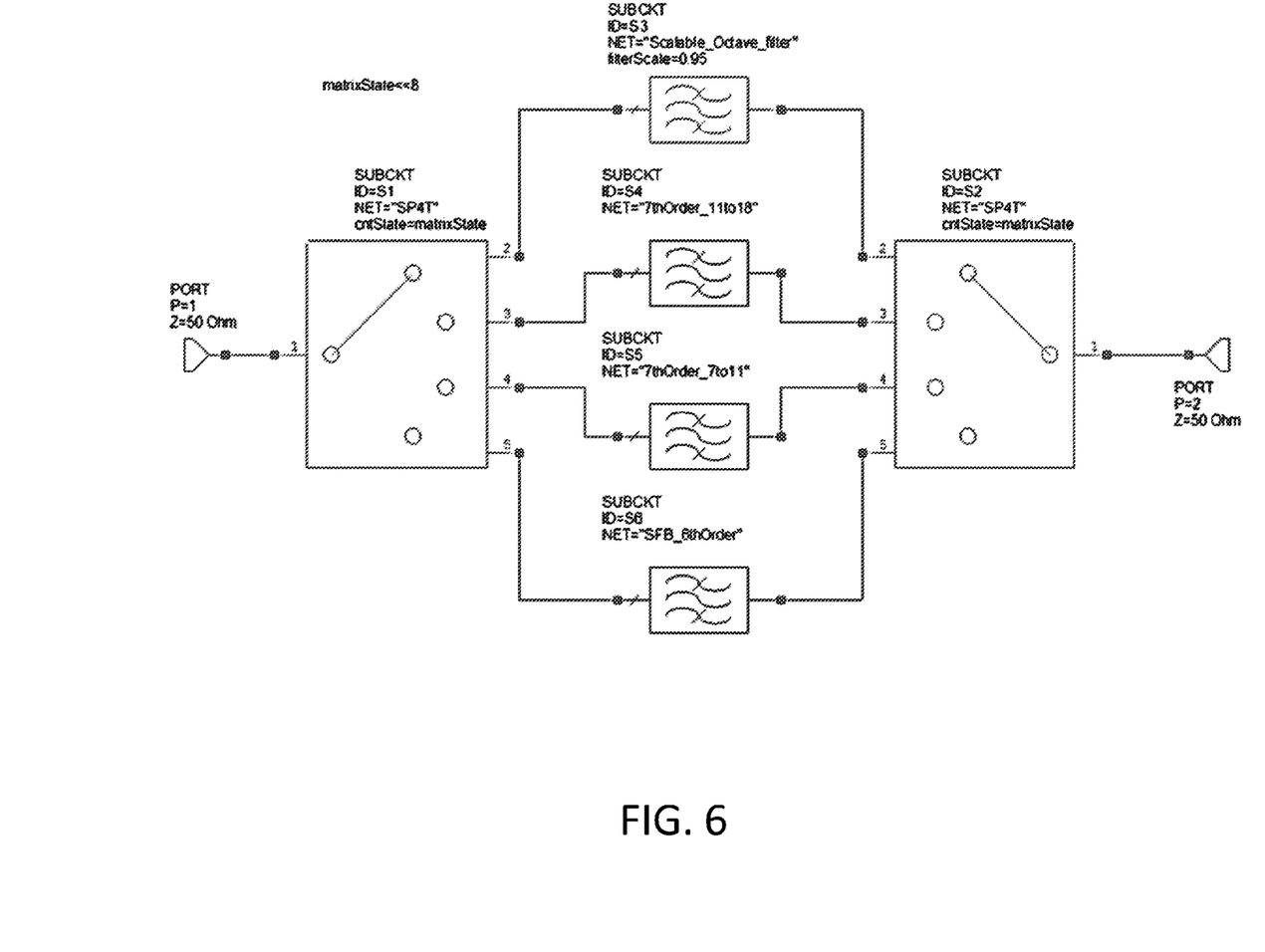
FIG. 6 schematically illustrates an exemplary circuit diagram of a 4 filter switched filter bank of the present invention, in which an input signal can be routed by a 1:4 switch matrix to one of the four individual filters.
Figure 7:
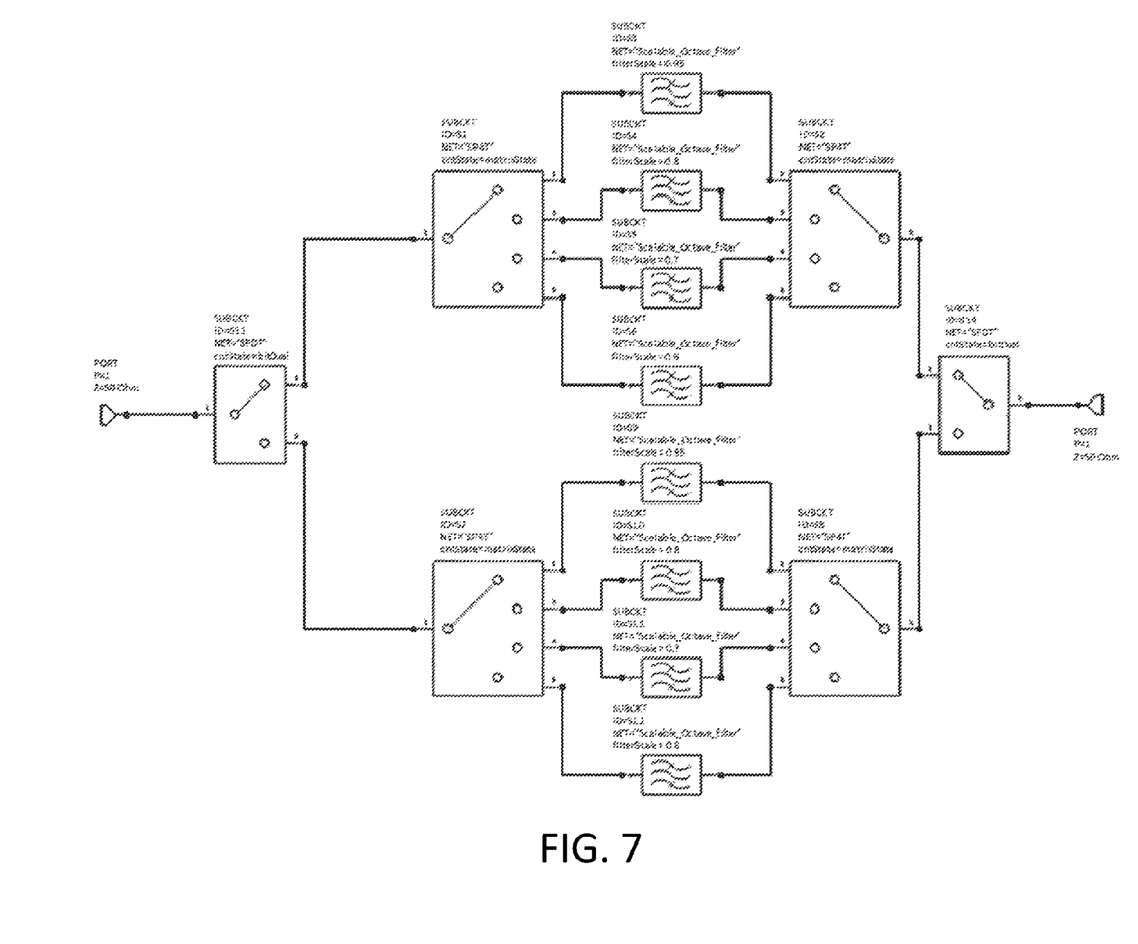
FIG. 7 schematically illustrates an exemplary circuit diagram of an 8 filter switched filter bank of the present invention, in which an input signal can be routed by multiple 1:2 and 1:4 switch matrices to one of eight individual filters.

Turning now more particularly to the design and configuration of the filters within and among the PS filter/routing boards, FIGS. 6 and 7 schematically illustrate circuit diagrams illustrating how filters may be distributed and may be selected by switches. FIG. 6 schematically illustrates four filters (ID=S3, S4, S5, S6) selectable by two switches (ID=S1, S2). The four separate filters S3-S6 may be independently designed and electrically isolated to operate at different RF frequencies and/or with different filtering characteristics. The output switch (ID=S2) may be configured to select the same filter S3-S6 as the input switch matrix (ID=S1) to route the signal from the input to the output. In a similar fashion, 8 filters (ID=S3, S4, S5, S6, S9, S10, S11, S12) may be provided in selectable using 6 switches (ID=S13, S1, S2, S7, S8, S14). In accordance with the present invention, the filters and routing of such circuits may be realized in three-dimensional structures, such as air-spaced (or other suitable dielectric) coaxial structures, which may be fabricated using PolyStrata® Technology.

Figure 8:
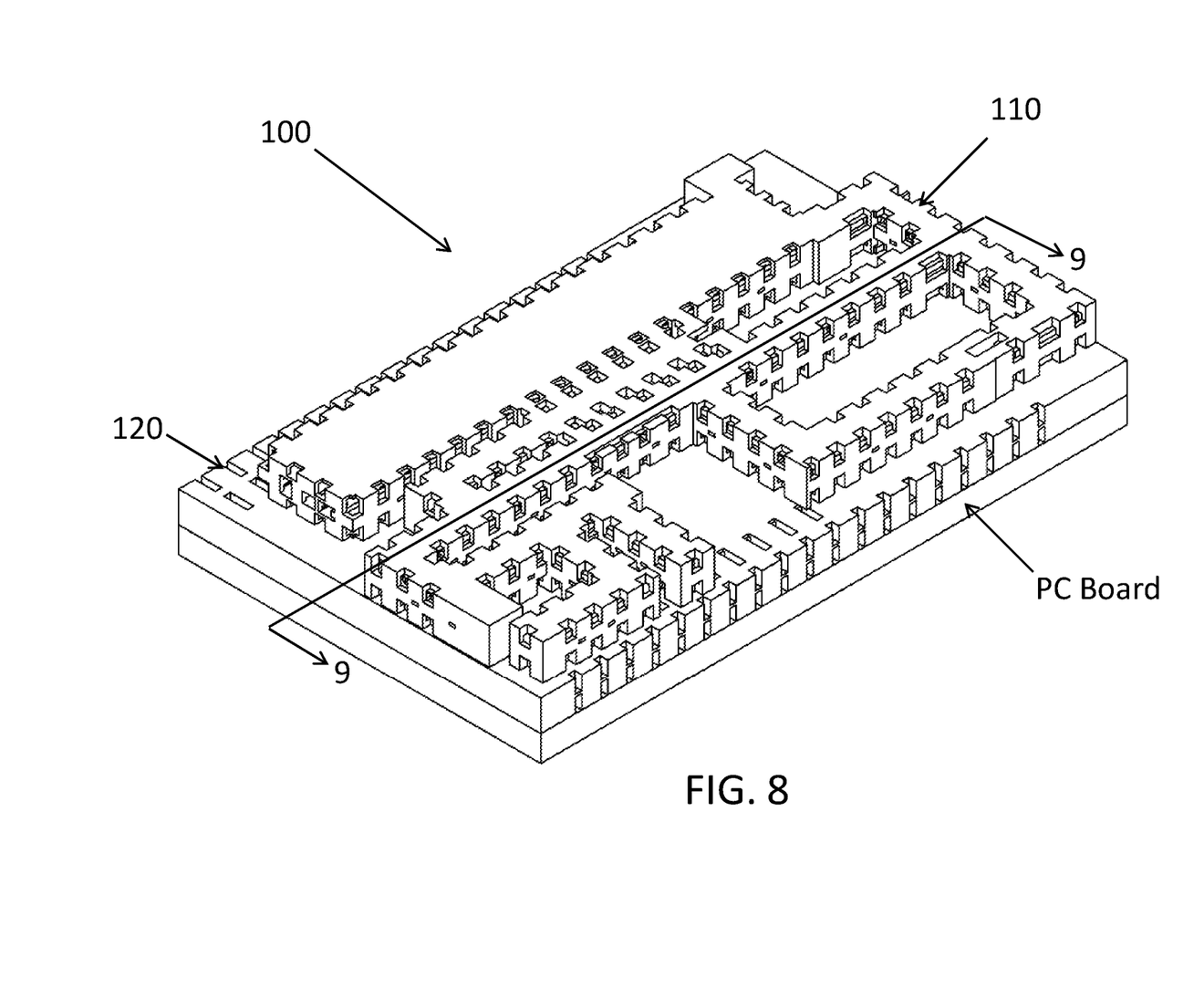
FIG. 8 schematically illustrates an exemplary physical realization the stacked switched filter bank of FIG. 6.
Figure 9:
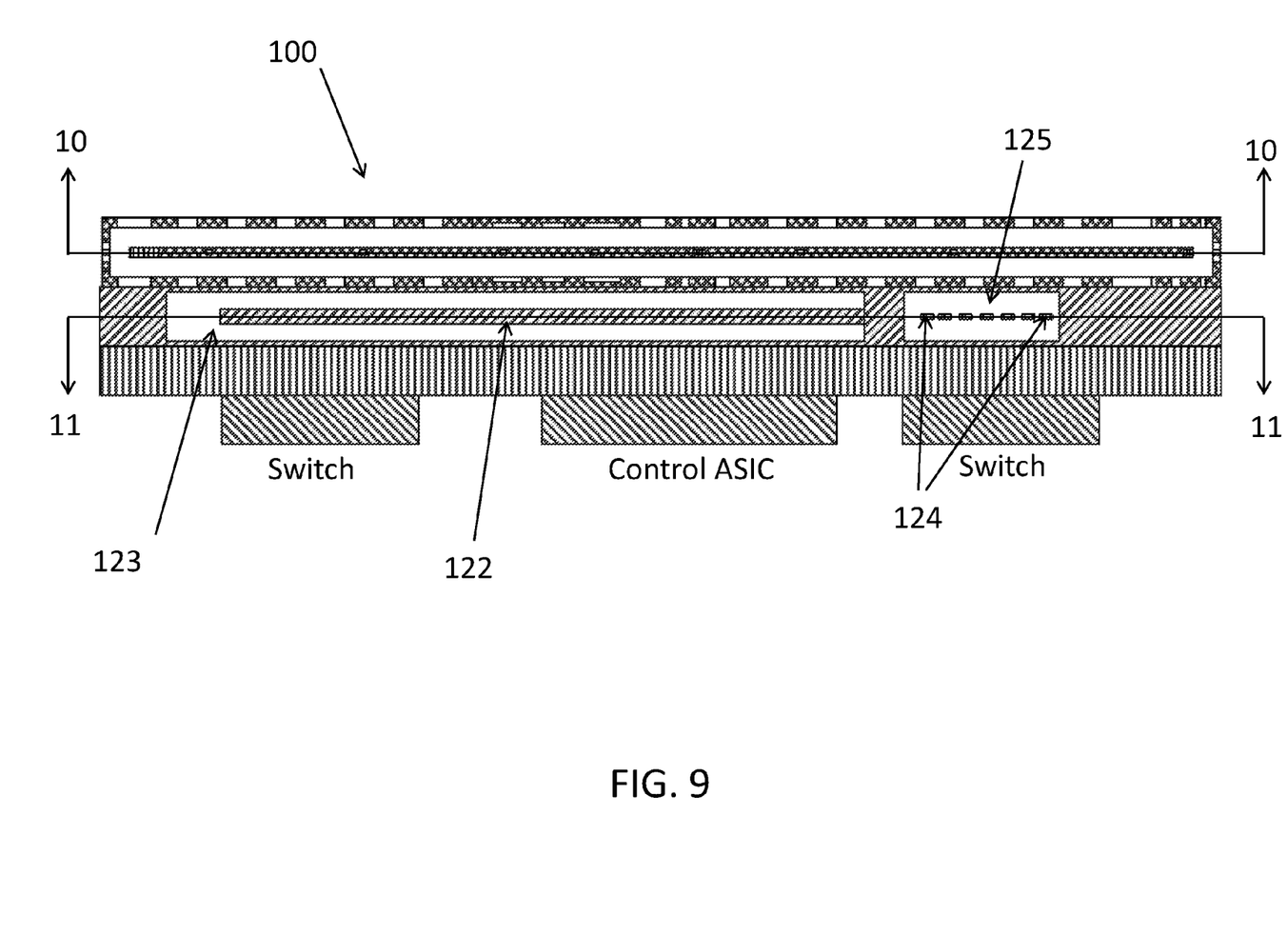
FIG. 9 schematically illustrates a cross-sectional view of the stacked switched filter bank of FIG. 8 taken along the sectioning line 9-9.
Figure 10:
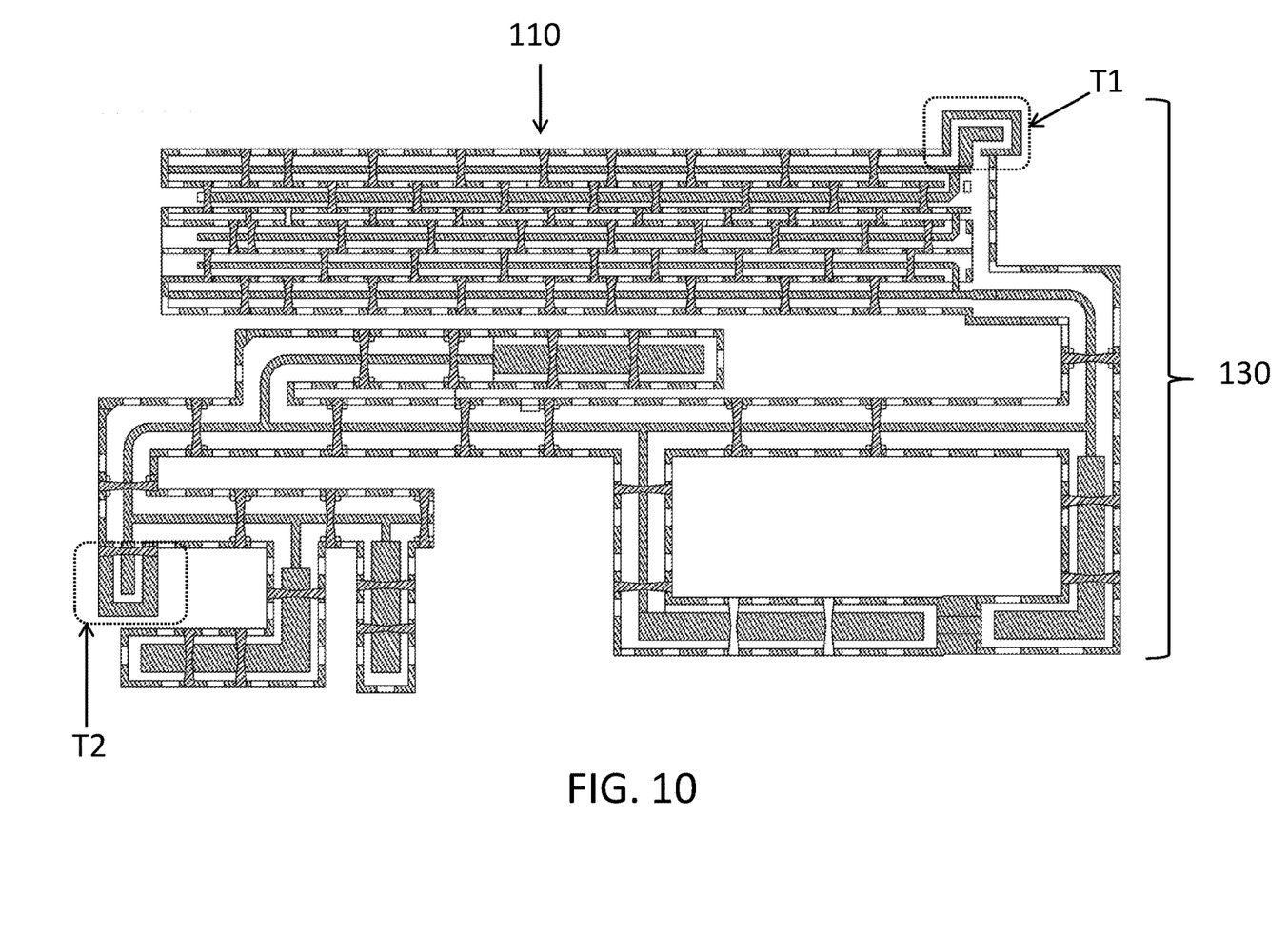
FIG. 10 schematically illustrates a cross-sectional view of the stacked switched filter bank of FIG. 9 taken along the sectioning line 10-10.

For instance, with reference to FIGS. 8 and 9, an exemplary physical realization of a stacked switched filter bank 100 in accordance with the present invention is illustrated having a first filter board 110 and a second filter board 120 disposed in stacked arrangement on a PC board. Each filter board 110, 120 may include one or more filters which may operate at different frequencies and may be selectable relative to one another by one or more switches. By way of example, the first filter board 110 may include a single filter 130 which operates in the frequency range of 2.5-5 GHz, FIG. 10, and the second filter board 120 may include three filters 132, 134, 136 which operate at 5-6 GHz, 7-12 GHz, and 12-18 GHz, respectively, FIG. 11. The first filter board 110 may be provided with two downward transitions, T1, T2 which allow electrical signals to transition out of the filter board 110 in a downward direction towards the second filter board 120. The downward transitions T1, T2 may have an L-shape having one leg in the plane of the filter board 110 and one leg perpendicular to the plane of the filter board 110, FIGS. 12, 13.

Figure 11:
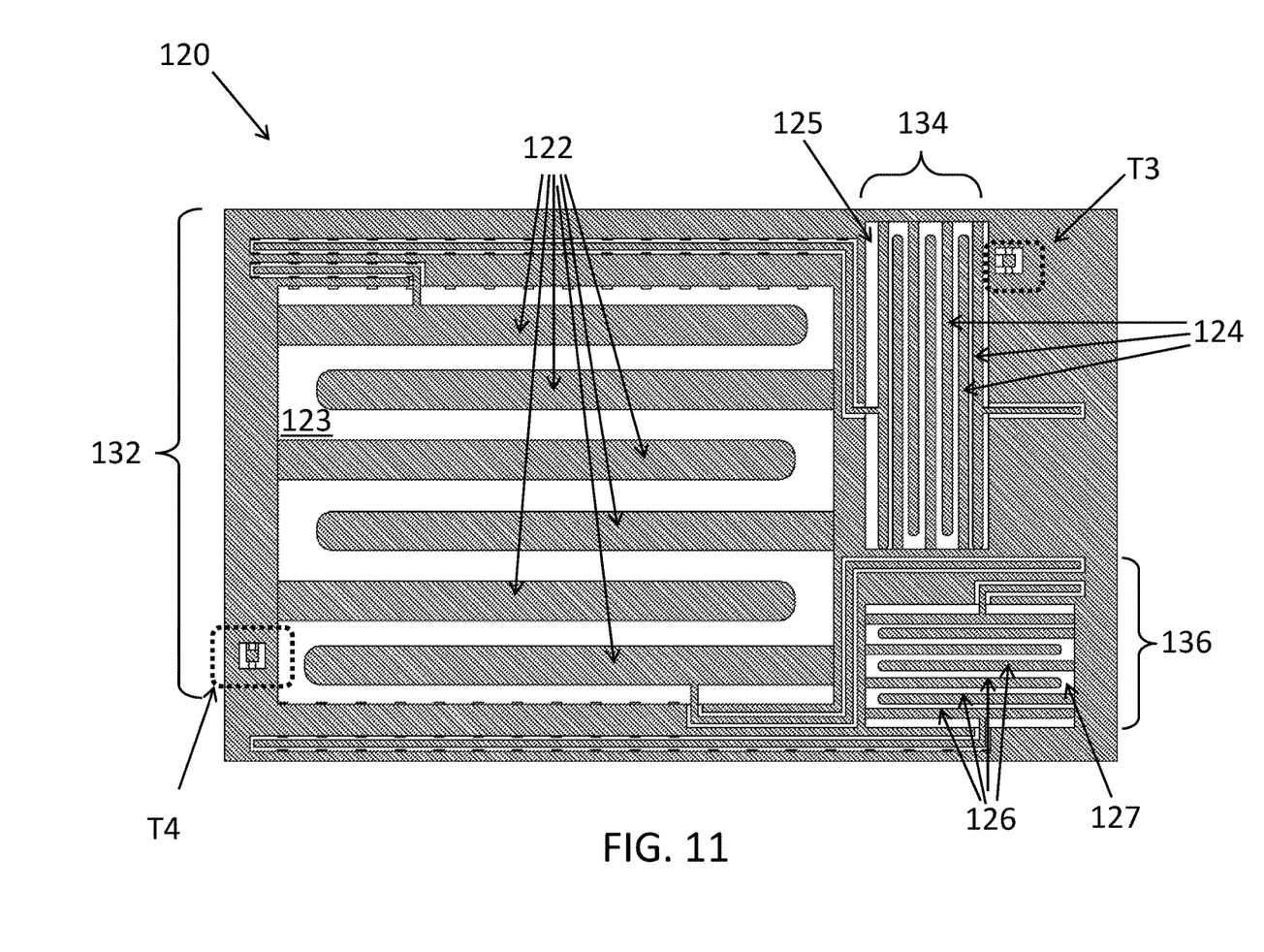
FIG. 11 schematically illustrates a cross-sectional view of the stacked switched filter bank of FIG. 9 taken along the sectioning line 11-11.
Figures 12, 13:
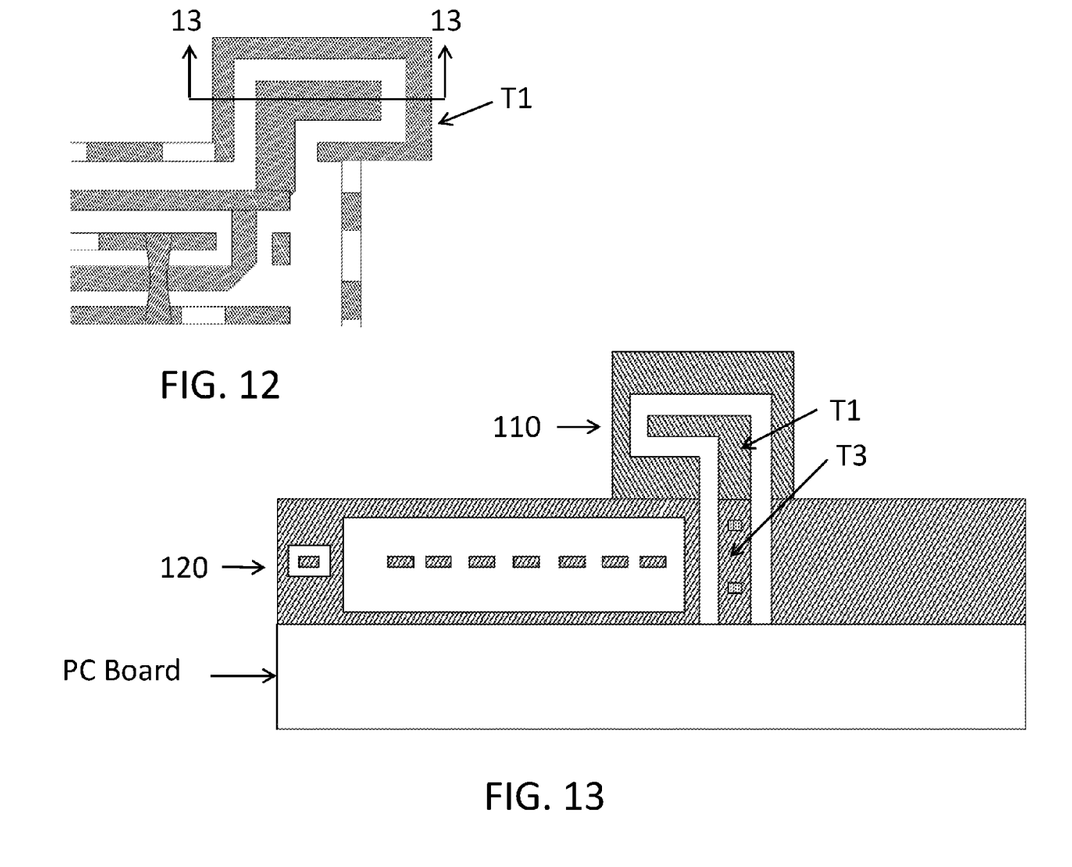
FIG. 12 schematically illustrates an enlarged view of one of the transitions illustrated in FIG. 10.
FIG. 13 schematically illustrates a cross-sectional view of the transition illustrated in FIG. 12 taken along the sectioning line 13-13.

The second filter board 120 in turn may include pass-through transitions T3, T4, each of which is disposed in electrical communication with a respective one of the transitions T1, T2 of the first filter board 110, FIGS. 11, 13. The pass-through transitions T3, T4 may be provided in the form of a straight transmission line, to permit an electrical signal from the filter 130 of the first filter board 110 to pass through the second filter board 120 to electrically communicate with the PC board, FIG. 13. In particular, electrical signal passing through the transitions T3, T4 may be electrically isolated from the filters 132, 134, 136 of the second filter board 120. As such, each of the filters 130, 132, 134, 136 may be electrically isolated and separately selectable from one another via components such as the switches. Selection among the filters 130, 132, 134, 136 thus may permit selection based on the desired frequency of the filter, namely among 2.5-5 GHz, 5-6 GHz, 7-12 GHz, and 12-18 GHz, for example. One or more of the filters 130, 132, 134, 136 may be provided in a configuration in which resonators are disposed in a dielectric filled cavity. For example, with regard to the second filter board 120, resonators 122, 124, 126 may be provided in a respective air-filled filter cavity 123, 125, 127, FIGS. 9, 11.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A stacked, switched filter bank, comprising:
   a first filter board having opposing upper and lower surfaces and having a filter disposed therein, the filter having an input coaxial transmission line and an output coaxial transmission line, the input and output transmission lines each having a respective portion perpendicular to, and terminating at, the lower surface; and
   a second filter board having top surface disposed proximate the lower surface of the first filter board, the second filter board having a filter disposed therein and additionally having two pass-through coaxial transmission lines each of which is disposed in electrical communication with a respective one of the input and output coaxial transmission lines of the first filter board.

2. The stacked, switched filter bank according to claim 1, wherein each of the coaxial transmission lines of the first and second filter boards comprises an air-filled coaxial transmission line.

3. The stacked, switched filter bank according to claim 1, wherein the pass-through coaxial transmission lines of the second filter board each have a longitudinal axis disposed perpendicular to the top surface of the second filter board.

4. The stacked, switched filter bank according to claim 1, wherein the first filter board comprises a plurality of filters.

5. The stacked, switched filter bank according to claim 1, wherein the filter of the first filter board includes resonators disposed in a dielectric filled cavity.

6. The stacked, switched filter bank according to claim 1, wherein the filter of the first filter board includes resonators disposed in an air-filled cavity.

7. The stacked, switched filter bank according to claim 1, wherein the second filter board comprises a bottom surface opposing the top surface, and comprising a printed circuit board disposed proximate the bottom surface.

8. The stacked, switched filter bank according to claim 1, comprising a third board disposed between the first and second filter boards with a top surface of the third board proximate the lower surface of the first filter board, the third board having a filter disposed therein and having two pass-through coaxial transmission lines each of which is disposed in electrical communication with a respective one of the input and output coaxial transmission lines of the first filter board.

9. The stacked, switched filter bank according to claim 1, comprising one or more switches operably connected to each of the filters of the first and second filter boards.

10. A method of forming a stacked, switched filter bank by a sequential build process, comprising:
    depositing a plurality of layers, wherein the layers comprise one or more of a conductive material and a sacrificial photoresist material, thereby forming a structure comprising:
      a first filter board having opposing upper and lower surfaces and having a filter disposed therein, the filter having an input coaxial transmission line and an output coaxial transmission line, the transmission lines each having a portion perpendicular to, and terminating at, the lower surface;
      a second filter board having top surface and having a filter disposed therein and having two pass-through coaxial transmission lines; and
    stacking the boards such that the top surface of the second filter board is proximate the lower surface of the first filter board and such that each of pass-through coaxial transmission lines is disposed in electrical communication with a respective one of the input and output coaxial transmission lines of the first filter board.

11. The method according to claim 10, wherein each of the coaxial transmission lines comprises an air filled coaxial transmission line.

12. The method according to claim 10, wherein the first filter board comprises a plurality of filters.

13. The method according to claim 10, wherein one or more of the filters of the first filter board includes resonators disposed in a dielectric filled cavity.

14. The method according to claim 10, wherein the filter of the first filter board includes resonators disposed in a dielectric filled cavity.

15. The method according to claim 10, wherein the filter of the first filter board includes resonators disposed in an air-filled cavity.

* * * * *